(12) United States Patent
Shieh et al.

(10) Patent No.: US 7,862,962 B2
(45) Date of Patent: Jan. 4, 2011

(54) INTEGRATED CIRCUIT LAYOUT DESIGN

(75) Inventors: Ming-Feng Shieh, Yongkang (TW); Shinn-Sheng Yu, Hsinchu (TW); Anthony Yen, Jhubei (TW); Shao-Ming Yu, Zhubei (TW); Chang-Yun Chang, Taipei (TW); Jeff J. Xu, Jhubei (TW); Clement Hsingjen Wann, Carmel, NY (US)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 149 days.

(21) Appl. No.: 12/356,405

(22) Filed: Jan. 20, 2009

(65) Prior Publication Data

US 2010/0183961 A1 Jul. 22, 2010

(51) Int. Cl.
*G03F 9/00* (2006.01)
*G03C 5/00* (2006.01)

(52) U.S. Cl. .............................. 430/5; 430/30; 430/313; 430/315; 716/19

(58) Field of Classification Search .................... 430/5, 430/30, 313, 315; 716/19
See application file for complete search history.

(56) References Cited

U.S. PATENT DOCUMENTS

2008/0179705 A1* 7/2008 Noelscher et al. ........... 257/506
2010/0183958 A1* 7/2010 Inaba ............................. 430/5

* cited by examiner

*Primary Examiner*—Christopher G Young
(74) *Attorney, Agent, or Firm*—Haynes and Boone, LLP

(57) ABSTRACT

Provided is a method including layout design of an integrated circuit. A first pattern is provided. The first pattern includes an array of dummy line features and a plurality of spacer elements abutting the dummy line features. A second pattern is provided. The second pattern defines an active region of an integrated circuit device. An edge spacer element of the active region is determined. A dummy line feature of the array of dummy line features is biased (e.g., increased in width), the dummy line feature is adjacent an edge spacer element.

20 Claims, 10 Drawing Sheets

INTEGRATED CIRCUIT LAYOUT DESIGN

CROSS-REFERENCE

This application is related to U.S. patent application Ser. No. 12/370,152, filed Feb. 12, 2009 for "Method Of Pitch Halving", the entire disclosure of which is incorporated herein by reference.

BACKGROUND

The present disclosure relates generally to integrated circuits and more particularly to a method of layout design associated with an integrated circuit device.

The process of manufacturing integrated circuits (ICs) include several stages, of which, the definition of a pattern associated with the circuit is of critical importance. The pattern may be generated during the design process, and in particular in a layout design. The pattern may then be fabricated on a substrate using photolithography processes. There is significant pressure on the semiconductor industry to enable smaller and smaller critical dimensions of integrated circuits. Several approaches have been taken to decrease the linewidths of an IC even beyond the critical dimension provided by present lithography equipment (e.g., stepper or scanners). One such approach includes a method of fabricating integrated circuits by forming a masking element that provides a pattern at half critical dimension of the photolithography tool used. However, as critical dimensions further decrease, such approaches face issues such as insufficient process margins. The insufficient process margins may provide for errors in the linewidths of features fabricated on a substrate. Examples of errors that may occur include overlay errors between photomasks including patterns used to form the devices.

Therefore, what is needed is an improved method of layout design for a semiconductor device.

BRIEF DESCRIPTION OF THE DRAWINGS

FIG. 2a is a top view of a first pattern associated with the method of FIG. 1. FIGS. 2b and 2c are a top view and a cross-sectional view respectively of an embodiment of a substrate corresponding to the pattern of FIG. 2a.

FIGS. 3b and 3c are a top view and a cross-sectional view respectively of an embodiment of a substrate corresponding to the pattern of FIG. 3a.

FIGS. 4b and 4c are a top view and a cross-sectional view respectively of an embodiment of a substrate corresponding to the pattern of FIG. 4a.

DETAILED DESCRIPTION

Figure 1:
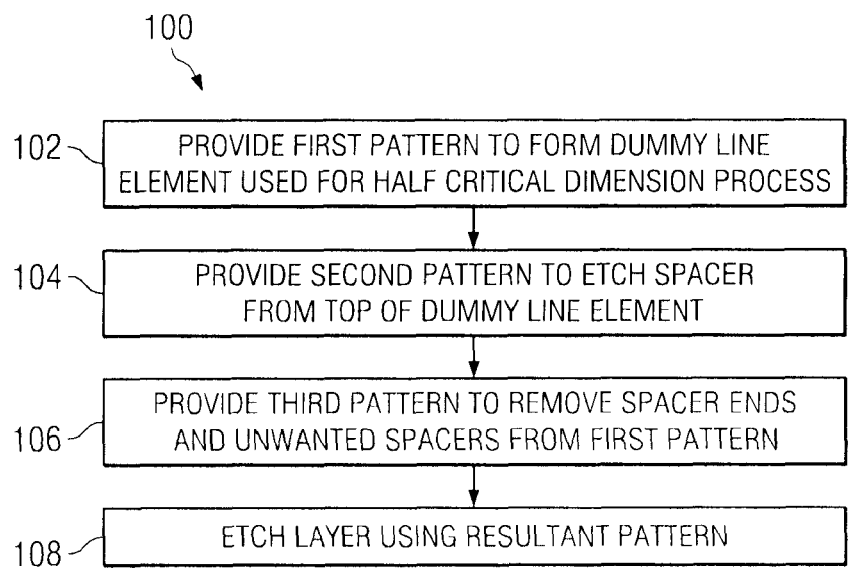
FIG. 1 is a flow chart illustrating an embodiment of a method of defining a pitch of features of a semiconductor device.

The present disclosure relates generally integrated circuit devices, and more particularly a method of layout design for features of an integrated circuit design. It is understood, however, that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. Moreover, descriptions of a first and second (e.g., a first layer of a layout file and a second layer of a layout file) provide no absolute order to the elements but are used to generally describe relationships between elements. The present disclosure refers to layout design to define a pitch for features including fins of a FinFET device, however one of ordinary skill in the art will recognize other applicable technologies and/or features of a device that may benefit from the disclosure.

Referring to FIG. 1, a flow chart illustrating a method 100 for fabricating a semiconductor device is provided. In an embodiment, the semiconductor device is a transistor such as a field effect transistor (FET) such as a FinFET (multi-gate transistor) device, or portion thereof. The method begins at step 102 where a first pattern is provided. The first pattern defines a configuration of dummy line structures (or features). In other words, the first pattern may provide features to be formed in a dummy layer of a substrate. The first pattern may define a critical dimension (e.g., linewidth or pitch of elements) to be formed. In an embodiment, the first pattern defines a pitch of fins of a FinFET device. For example, the first pattern may define a dummy line structure which is used to form spacer elements (e.g., abutting the line structure). The width and pitch of the spacer elements may define the width and the pitch of fins of finFET devices. The width and pitch of the fins may be provided at less than the minimum critical dimension of the photolithography process utilized (e.g., a half critical dimension process). A "pattern", as described throughout the disclosure, may be provided in a layout design file (e.g., GDSII file), a photomask, formed on a substrate, and/or in other suitable forms.

Figure 2C:
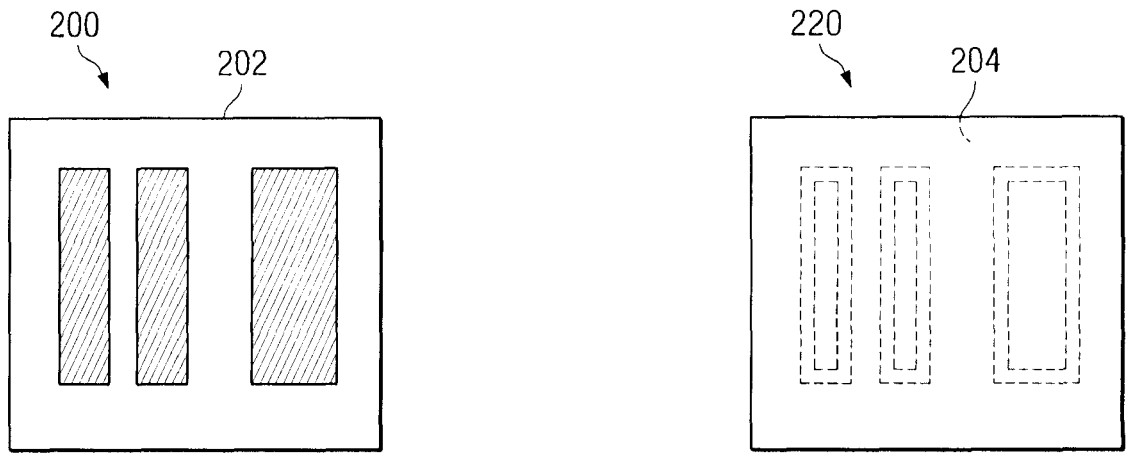

Referring to the example of FIGS. 2a, 2b, and 2c, a first pattern 200 is illustrated. The first pattern 200 includes a plurality of line elements. The first pattern 200 is exemplary only and not intended to be limiting, any configuration and quantity of elements providing a pattern is possible. The first pattern 200 may be determined from a layout design file and formed on a photomask 202. The photomask 202 may be a attenuating phase shift mask (att-PSM), an alternating PSM (alt-PSM), a chromeless phase shift mask (CPL), and/or other suitable mask types. The photomask 202 includes a substrate. The substrate may be a transparent substrate such as fused silica ($SiO_2$), or quartz, relatively free of defects, calcium fluoride, or other suitable material. The photomask 202 may include attenuating material defining the pattern; the attenuating material may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination thereof.

FIGS. 2b and 2c illustrate a semiconductor substrate 204 including a pattern 220 formed thereon. In an embodiment, the substrate 204 is silicon in a crystalline structure. In alternative embodiments, the substrate 204 may include other elementary semiconductors such as germanium, or includes a compound semiconductor such as, silicon carbide, gallium arsenide, indium arsenide, and indium phosphide. The pattern 220 is defined by the pattern 200 of the photomask 202—the pattern 220 is formed using photolithography processing that exposure the substrate 204 to the pattern 200.

A dummy layer 212 is disposed on the substrate 204. The dummy layer 212 may include amorphous carbon, polysilicon, and/or other suitable material. In illustrated embodiments, the dummy layer 212 is the target layer in which the pattern (e.g., half critical dimension features) provided by the method 100 is to be formed. Numerous other embodiments and layers may be possible. A plurality of hard mask layers 210a and 210b are disposed on the substrate 204. The dummy layer 208 has been patterned to form a plurality of dummy features having the pattern 220. The dummy layer 208 may include amorphous carbon, polysilicon, and/or other suitable materials. A spacer layer 206 is formed on the dummy layer 208. The spacer layer 206 may include silicon oxide, silicon nitride, silicon oxynitride, and/or other suitable materials. The spacer layer 206 may define a critical dimension of an element to be formed on the substrate 204. For example, in an embodiment the spacer layer 206 will define a width and a pitch for elements formed in the dummy layer 212, as described in greater detail below. The elements in the dummy layer 212 may be used as masking elements in further processing of the substrate 204. For example, the dummy layer 212 may be used as a masking element in an etching process of the substrate 204, which forms a plurality of fins for a FinFET device.

Thus, the first pattern provides dummy line features which allow for adjacent spacers to be formed. The dummy features, along with the abutting spacers, may define a critical dimension for a feature, such as a fin, to be formed on the substrate.

Figure 3A:
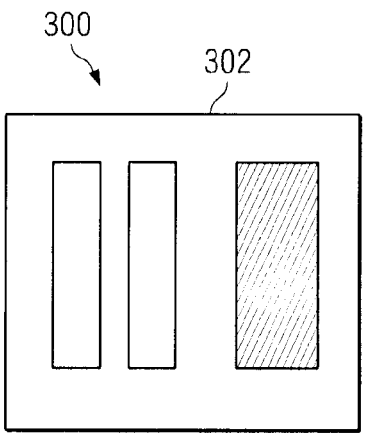
FIG. 3a is a top view of a second pattern associated with the method of FIG. 1.
Figure 3B:
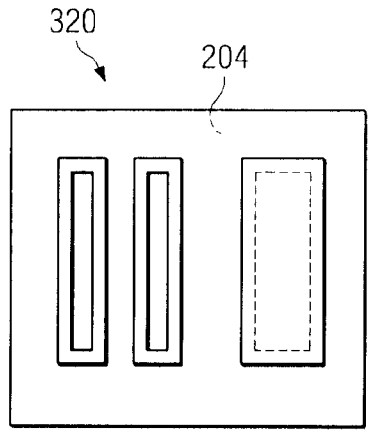
Figure 3C:
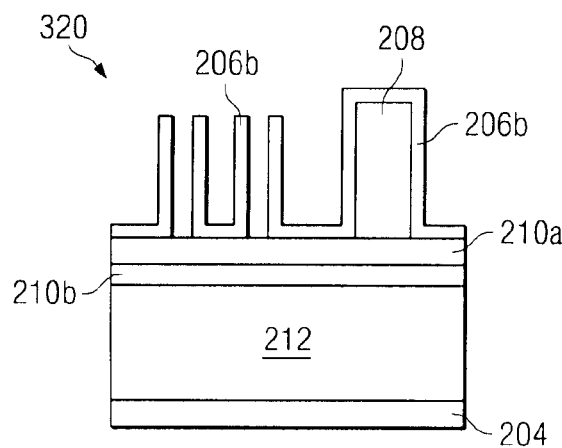

The method 100 then proceeds to step 104 where a second pattern is provided. The second pattern may remove a portion of a spacer layer overlying dummy line features defined by the pattern of step 102. The second pattern may remove a dummy line feature. FIGS. 3a, 3b, and 3c illustrate an example. In FIG. 3a, a pattern 300 is formed on a photomask 302. The photomask 302 may be substantially similar to the photomask 202, described above with reference to FIG. 2a. FIGS. 3b and 3c illustrate a top view and a cross-sectional view of a pattern 320 provided on the substrate 204. The pattern 320 is formed by photolithography processes using the pattern 300 of the photomask 302. The pattern 300 defines portions of a spacer element to be removed and a plurality of dummy line features to be removed from the substrate 204. A plurality of spacer elements 206b are formed. The spacer elements 206b may define a pitch/width for an element of a semiconductor device (e.g., a fin of FinFET).

Figure 2C:
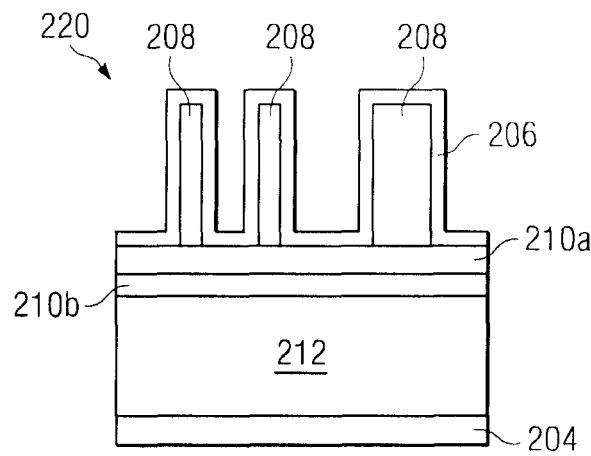
Figure 4A:
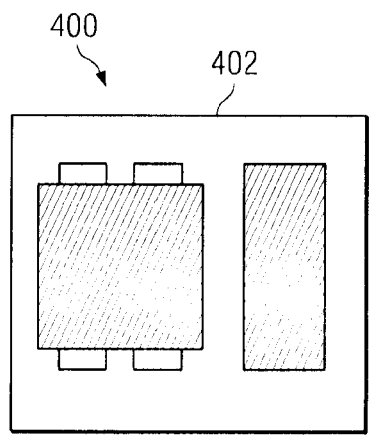
FIG. 4a is a top view of a third pattern associated with the method of FIG. 1.
Figure 4B:
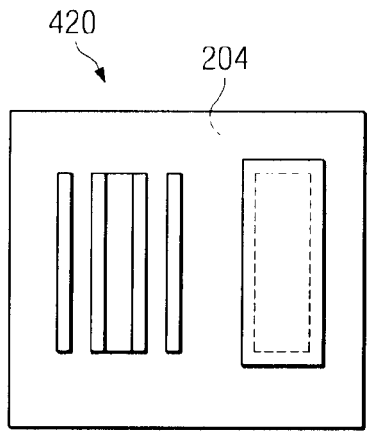
Figure 4C:
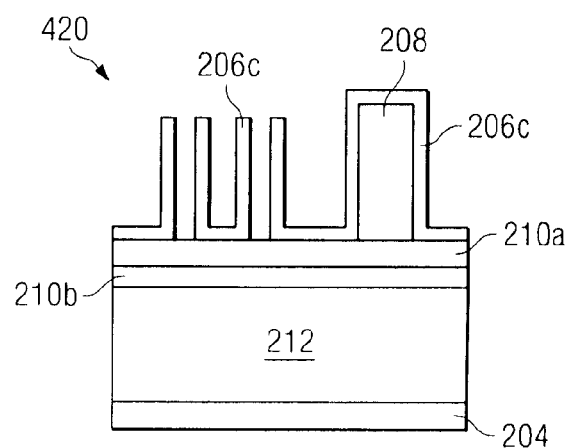

The method 100 then proceeds to step 106 where a third pattern is provided. The third pattern may be known as a cut pattern or an OD pattern (e.g., defining the active area). The third pattern may remove unwanted spacer elements and/or ends of spacer elements previous formed using the patterns of steps 102 and 104. FIGS. 4a, 4b, and 4c illustrate an example. In FIG. 4a, a pattern 400 is illustrated on a photomask 402. The photomask 402 may be substantially similar to the photomask 202, described above with reference to FIG. 2. FIGS. 4b and 4c illustrate a top view and a cross-sectional view of a pattern 420 provided on the substrate 402. The pattern 420 is formed on the substrate 402 by photolithography processes exposing the substrate 402 to the pattern 400. Thus, the pattern 420 includes spacer elements having portions at end of the dummy line features removed. One or more spacer elements have also been removed from the substrate 204 (e.g., those falling outside the defined active area). Therefore, the pattern 420 includes a grid of spacer elements 206c formed on the substrate 202 in a selected area (e.g., active area).

Figure 5A:
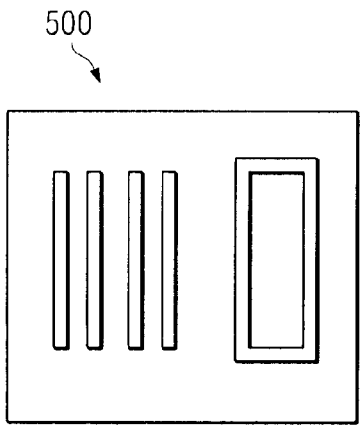
FIGS. 5a, 6a, 5b, and 6b are top views and cross-sectional views, respectively, of embodiments of a substrate corresponding to the method of FIG. 1.
Figure 5B:
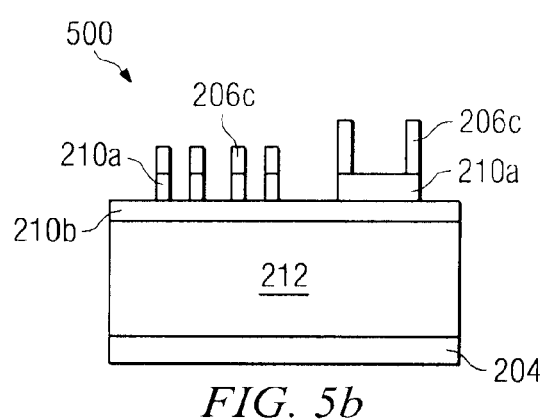

The method 100 then proceeds to step 108 where the resultant pattern (e.g., the pattern formed from the overlay of the first, second and third patterns described above) is used to process (e.g., etch) the substrate. The resultant pattern forms a masking element. The masking element may be formed by etching a hard mask layer. Referring to the example of FIGS. 5a and 5b, illustrated are a top view and side view of the substrate 204 corresponding to step 108. The hard mask layer 210a has been patterned using the dummy layer 208 and/or the spacer layer 206c, described above. The hard mask layer 210a may include silicon nitride, silicon oxynitride, silicon carbide, and/or other suitable dielectric materials. The dummy layer 208 and the spacer layer 206c have been removed from the substrate 204.

Figure 6A:
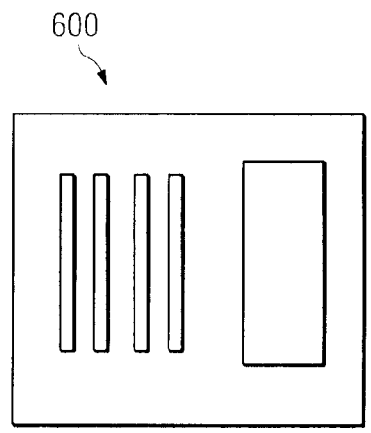
Figure 6B:
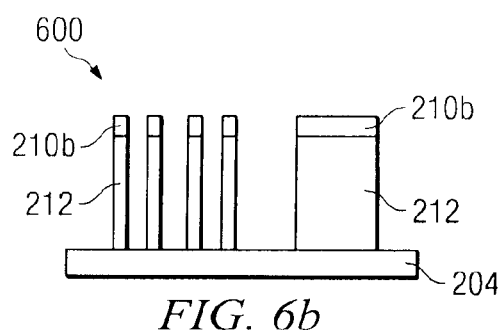

The method 100 may continue to pattern a target dummy layer. The target dummy layer may be patterned to form a grid of masking elements. Referring to the example of FIGS. 6a and 6b, illustrated are a top view and cross-sectional view of the substrate 204. The pattern (e.g., the resultant pattern of the combination of the first, second and third patterns described above) has been formed in the dummy layer 212. In an embodiment, the hard mask 210a is used as a masking element to form the pattern in the dummy layer 212. The hard mask layer 210a is subsequently removed from the substrate 204. The hard mask layer 210b may also be patterned simultaneously to and/or prior to the patterning of the dummy layer 212. In alternative embodiments, one or more layers depicted may be omitted such as, the hard mask layer 210a or 210b.

Therefore, a patterned dummy layer 212 is formed. As illustrated above, the patterned dummy layer 212, as illustrated in FIGS. 6a and 6b, maybe formed using, successively, first, second, and third patterns each provided in a photomask. The patterned dummy layer 212 (and/or the hard mask layer 210b) may be used as a masking element to form devices on the substrate 204. In an embodiment, the patterned dummy layer 212 is used as a masking element for forming fins in the substrate 204. The fins maybe formed by etching the substrate 204.

Figure 7:
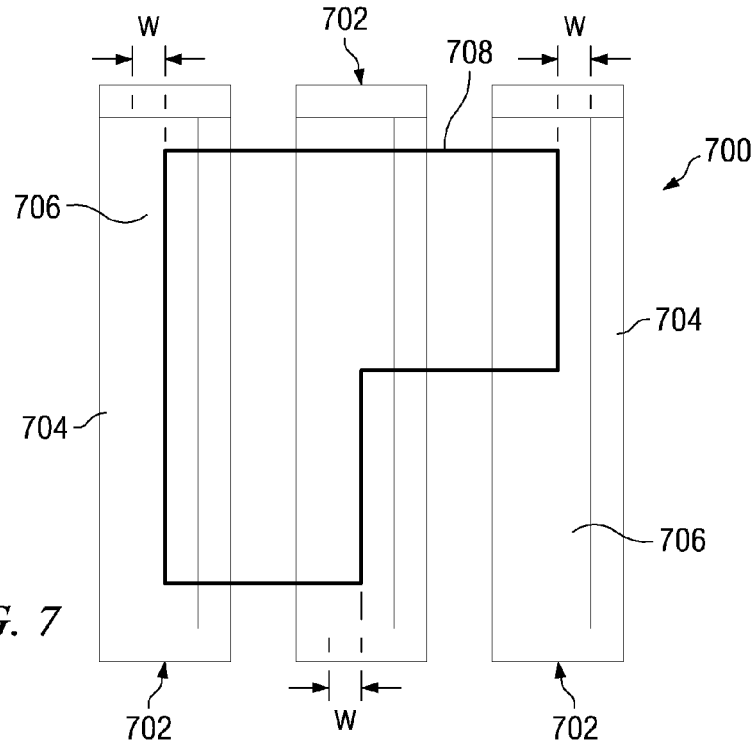
FIG. 7 is a top view illustrating an overlay offset margin of a plurality of patterns.

Referring now to FIG. 7, illustrated is a pattern 700. The pattern 700 may be provided in a layout design file, a photomask, and/or other suitable means. The pattern 700 includes a first pattern 702 and a second pattern 708. The first pattern 702 includes a grid dummy features 706 and corresponding spacer elements 704. The first pattern 702 may be substantially similar to the pattern 200, described above with reference to FIG. 2a. The first pattern 702 may be formed on a first photomask and/or defined on a first layer of a layout design file. The spacer elements 704 may be formed abutting the dummy elements 706. The second pattern 708 may define an active area of a device associated with the pattern 700. The pattern 708 may be substantially similar to the pattern 400, described above with reference to FIG. 4a. The pattern 708 may define an area outside of which the elements 704 and 702 are removed/not formed on a substrate.

The accurate overlay of the first pattern 702 and the second pattern 708 is to be considered in forming the resultant pattern 700. The overlay process margin (overlay error budget) is represented by W. The overlay margin W may represent the overlay process margin between the first pattern 702 and the second pattern 708.

In an embodiment, the dummy feature 706 defines a spacing between fins. The spacer element 704 may define the width of a fin. In an embodiment, the fin spacing is approximately 27 nanometers. In an embodiment, the fin width is approximately 18 nm. Thus, a pitch of 45 nm may be provided. These dimensions are exemplary only and not intended to be limiting. A patterning pitch of 45 nm may create a small overlay process margin (W) that provides difficulties during fabrication of devices associated with the pattern 700.

Figure 8:
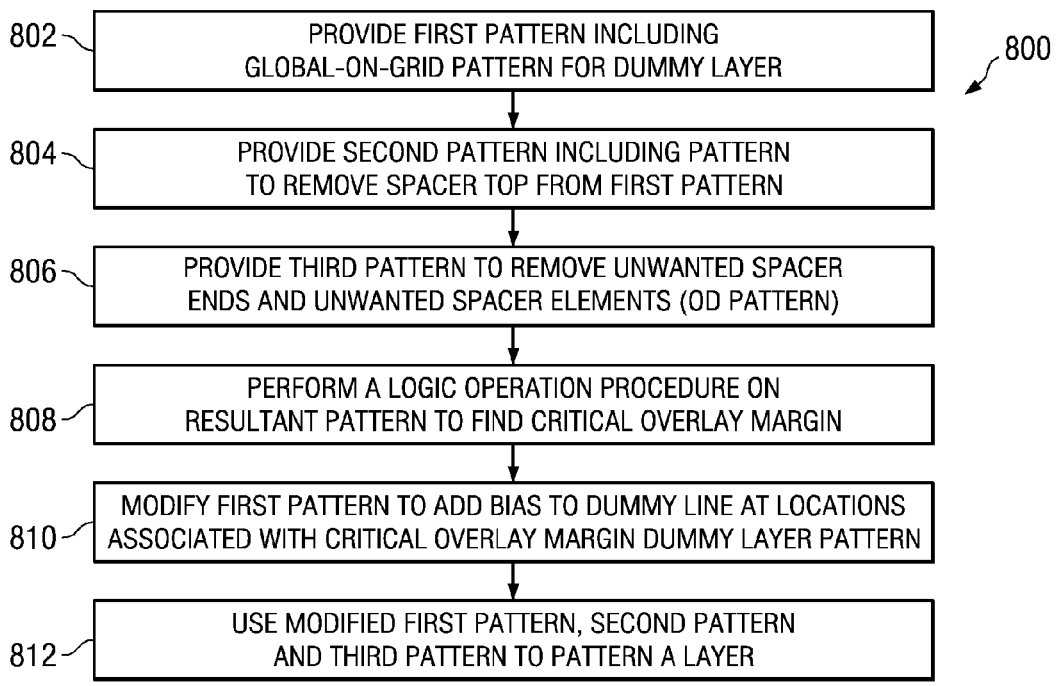
FIG. 8 is a flow chart illustrating an embodiment of a method of layout design for a semiconductor device.

Referring now to FIG. 8, illustrated is a method 800 for a determining a layout design of a semiconductor device. The method 800, or portions thereof, may be executed by a computer system such as the computer system 1500, described below with reference to FIG. 15. The method 800 may increase an overlay process margin, described above with reference to FIG. 7. The method 800 begins at step 802 where a first pattern is provided. The first pattern generates a global-on-grid pattern of a dummy layer. The first pattern may be substantially similar to the pattern described above with reference to step 102 of the method 100. The first pattern may include a plurality of dummy features in a grid array. The dummy features may allow for spacer elements to be formed abutting the dummy feature. The spacer elements define a pattern having a reduced critical dimension, for example, a critical dimension less (e.g., half) of that provided by the photolithography tool in exposing a photomask. The spacers pitch may define a pitch and/or width of fins to be fabricated on a substrate.

Figure 9:
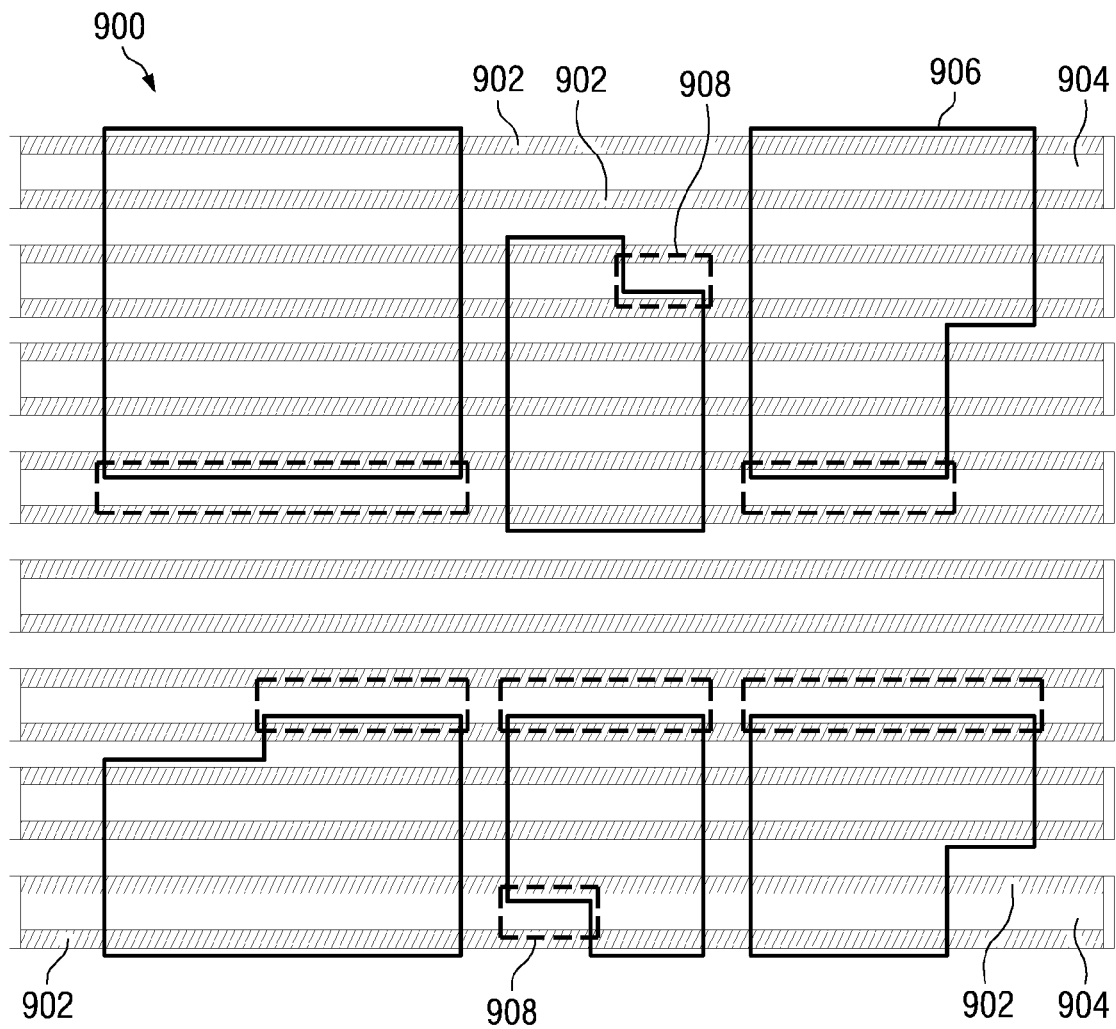
FIGS. 9-14 are top views of patterns associated with the layout design method of FIG. 8.

FIG. 9 illustrates a pattern 900 that includes a global-on-grid pattern of dummy elements 904. Spacer elements 902 are formed abutting the dummy elements 904.

Referring again to FIG. 8, the method 800 proceeds to step 804 where a second pattern is provided. The second pattern may be intended to overlay the first pattern. The second pattern may be substantially similar to the pattern described above with reference to step 104 of the method 100. The second pattern may remove a portion of a spacer element provided by the first pattern. In particular, the second pattern may remove a portion of a spacer element overlying a dummy element of the global-on-grid pattern.

The method 800 then proceeds to step 806 where a third pattern is provided. The third pattern may define an active area of the associated device. The third pattern may overlie (e.g., be intended to be provided subsequently to and aligned with) the first and/or second pattern. The third pattern may remove unwanted ends of the spacer elements formed using the pattern described above in step 802. The third pattern may remove undesired spacer elements and/or line features formed using the pattern described above in step 802. The undesired spacer elements/line features may include those elements lying outside an active area of the associated device. The third pattern may be substantially similar to the pattern described above with reference to step 106 of the method 100.

Referring to the example of FIG. 9, a pattern 906 is provided. The pattern 906 is an exemplary embodiment of the third pattern described above with reference to step 806. The pattern 906 defines the active area of the device, for example, defining the areas in which fins (e.g., of a finFet device) are to be formed on the device.

Referring again to FIG. 8, the method 800 then proceeds to step 808 where a logic operation procedure is performed on the resultant layout (e.g., the combination/overlay patterns). In an embodiment, the logic operation procedure is performed on the overlay and alignment of the first and third patterns. The logic operation procedure may find one or more locations on the resultant pattern having a critical overlay margin, for example, between the first and third patterns. The critical overlay margin locations may include those locations on the resultant pattern where the margin in error between the overlay of the first and third patterns are insufficient. This margin may be determined by process limitations, design tolerances, etc. The logic operation procedure may be performed using a design rule check (DRC) and/or other suitable methods.

Figure 10:
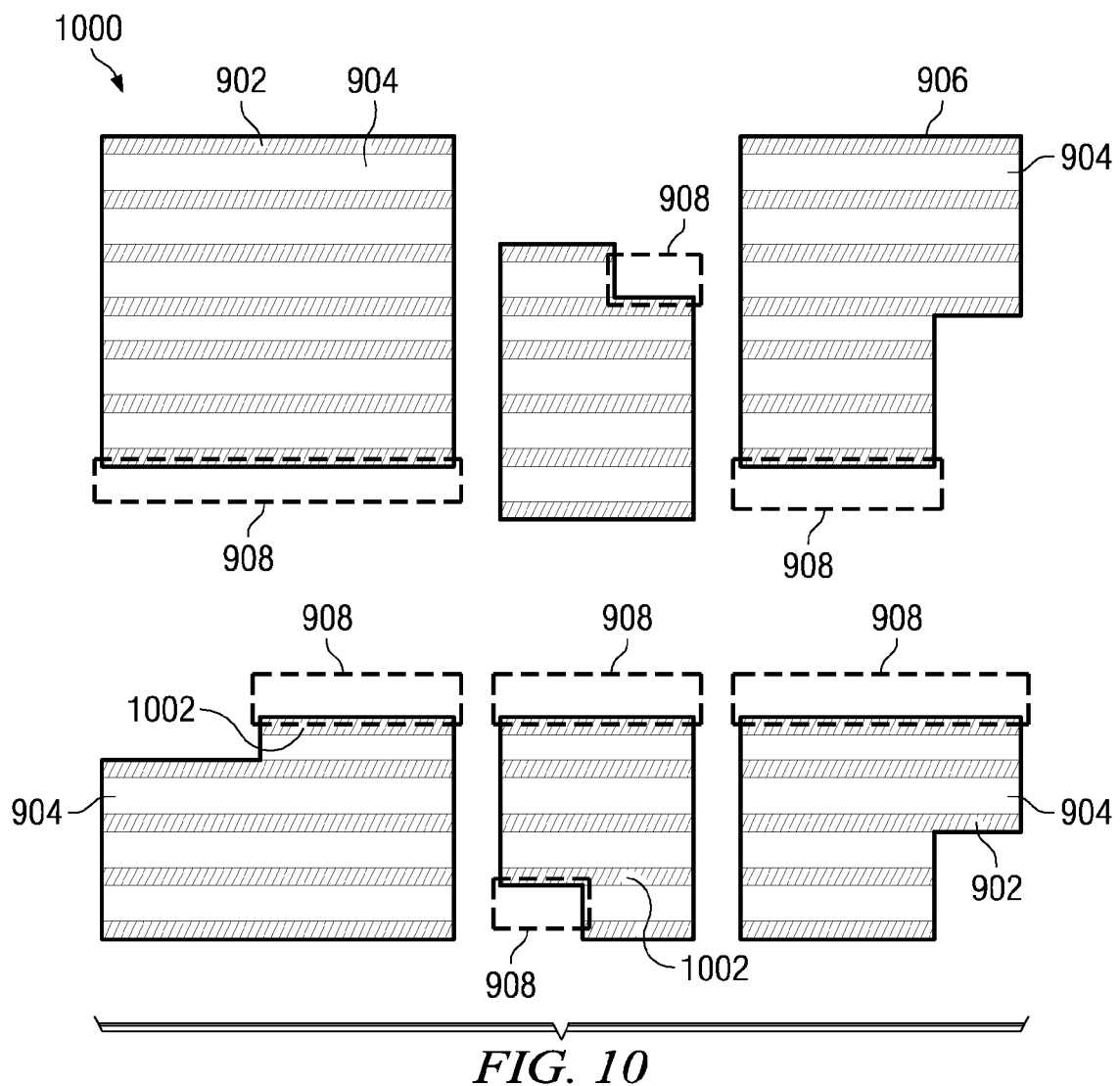

Referring to the example of FIGS. 9 and 10, illustrated are locations 908 having a critical overlay margin. The critical overlay margin location 908 may include an edge feature 1002 (e.g., a spacer that is to be used to form an edge fin to an active (OD) area). The critical overlay margin locations 908 illustrate regions where a bias may be added to the adjacent feature(s) as described in further detail below.

The method 800 then proceeds to step 810 where the first pattern, described above with reference to step 802, is modified. The pattern is modified to add bias to dummy line features at locations associated with the identified critical overlay margin areas. Adding bias includes modifying the dimensions of the line. In an embodiment, biasing a feature (e.g., a line feature) includes increasing the width of the feature. The biasing may provide to protect features of the first pattern in the critical overlay margin areas. The biasing may also provide for increased overlay margin in the determined critical overlay margin areas. Thus, in embodiments, the biasing protects edge lines of the pattern (e.g., edge dummy features, spacer elements formed on the edge dummy features, and/or edge fins).

Figure 11:
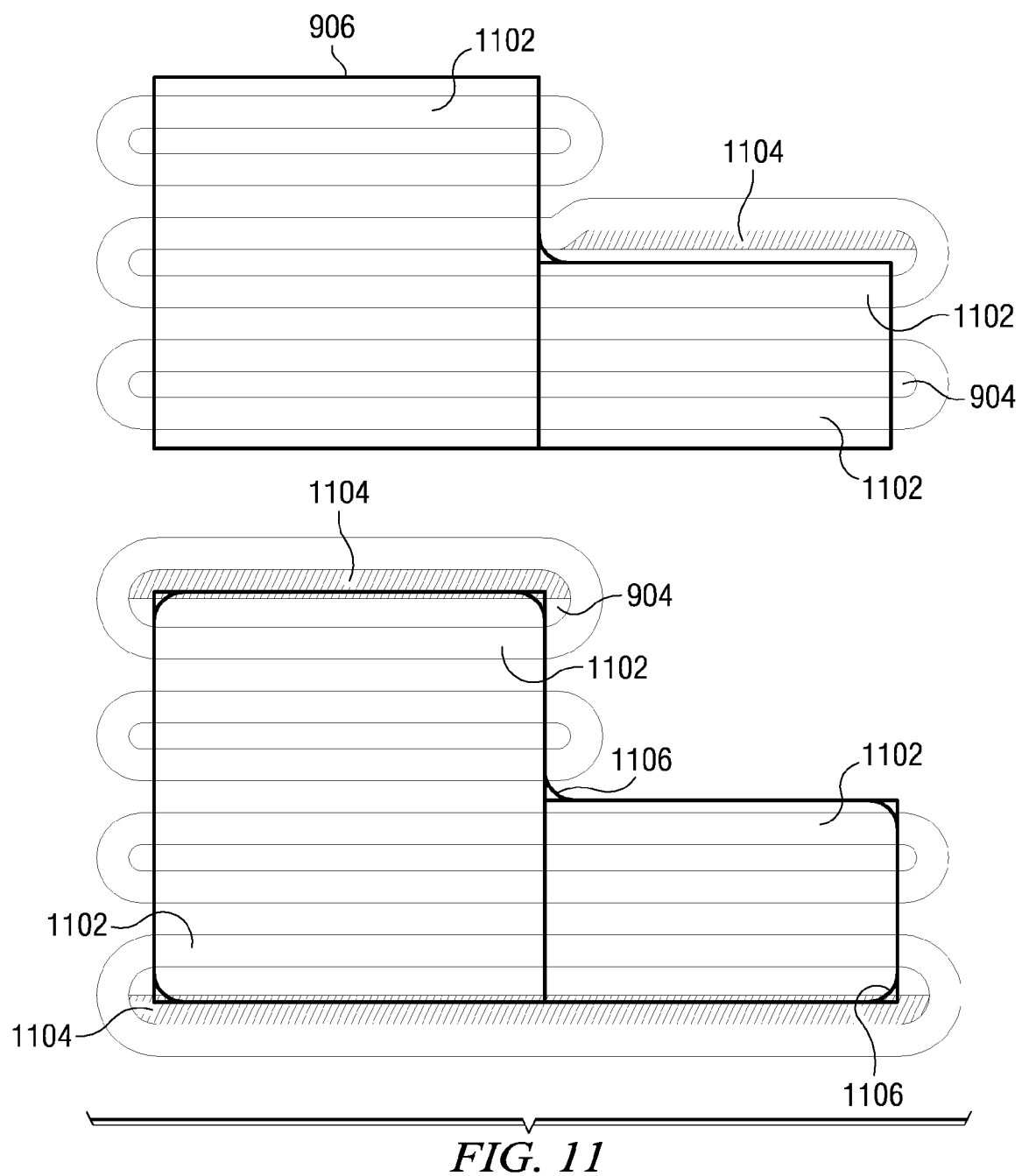

Referring to the example of FIG. 11, illustrated is a bias portion 1104 added to dummy line features 904 in the critical overlay margin areas. The reference line 1106 illustrates lithography effects (e.g., difference between feature as drawn and as fabricated) typical in forming a pattern on a wafer. The bias portion 1104 provides an increased overlay margin which may provide for reduced impact of lithography effects and/or more accurate formation of the edge spacer elements 1102. The bias portion 1104 may be provided by increasing the width of the associated dummy element 904. In an embodiment, the bias portion 1104 is less than approximately 50 nanometers. In an embodiment, the bias portion 1104 is between approximately 3 and 30 nanometers.

Figure 12:
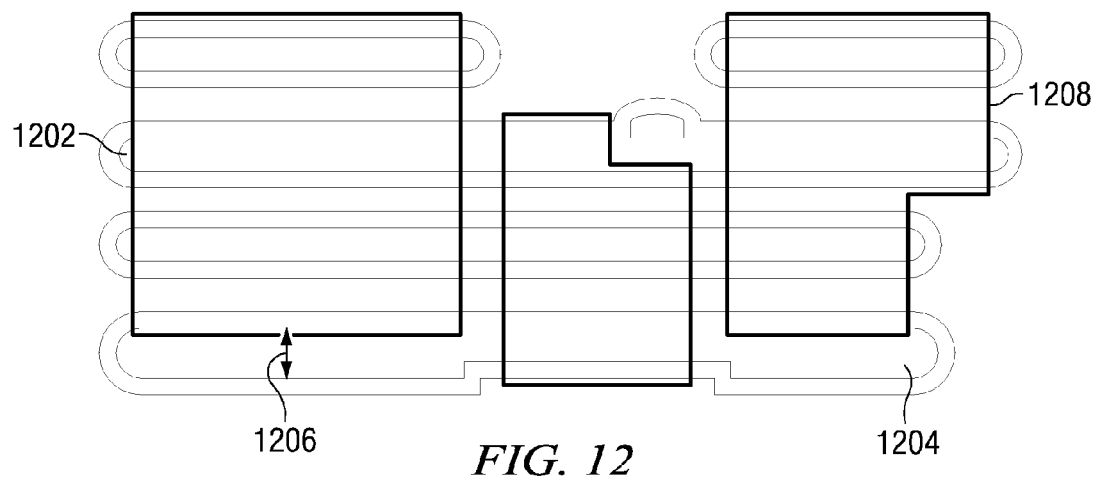

FIG. 12 illustrates the incorporation of a bias region 1204 into selected areas of a line feature 1202. The bias 1204 provides an increased overlay margin 1206 between the line feature 1202 pattern and a pattern 1208. The line features 1202 may be substantially similar to the dummy line features 904, described above with reference to FIGS. 9, 10, and 11. The pattern 1208 may be substantially similar to the pattern 906, described above with reference to FIGS. 9, 10, and 11. Thus, FIG. 12 illustrates the distortion form a global-on-grid pattern (such as illustrated in pattern 900 of FIG. 9) by the addition of a bias. However, a local-on-grid pattern remains, for example, in the regions defined by the pattern 1208.

Figure 13:
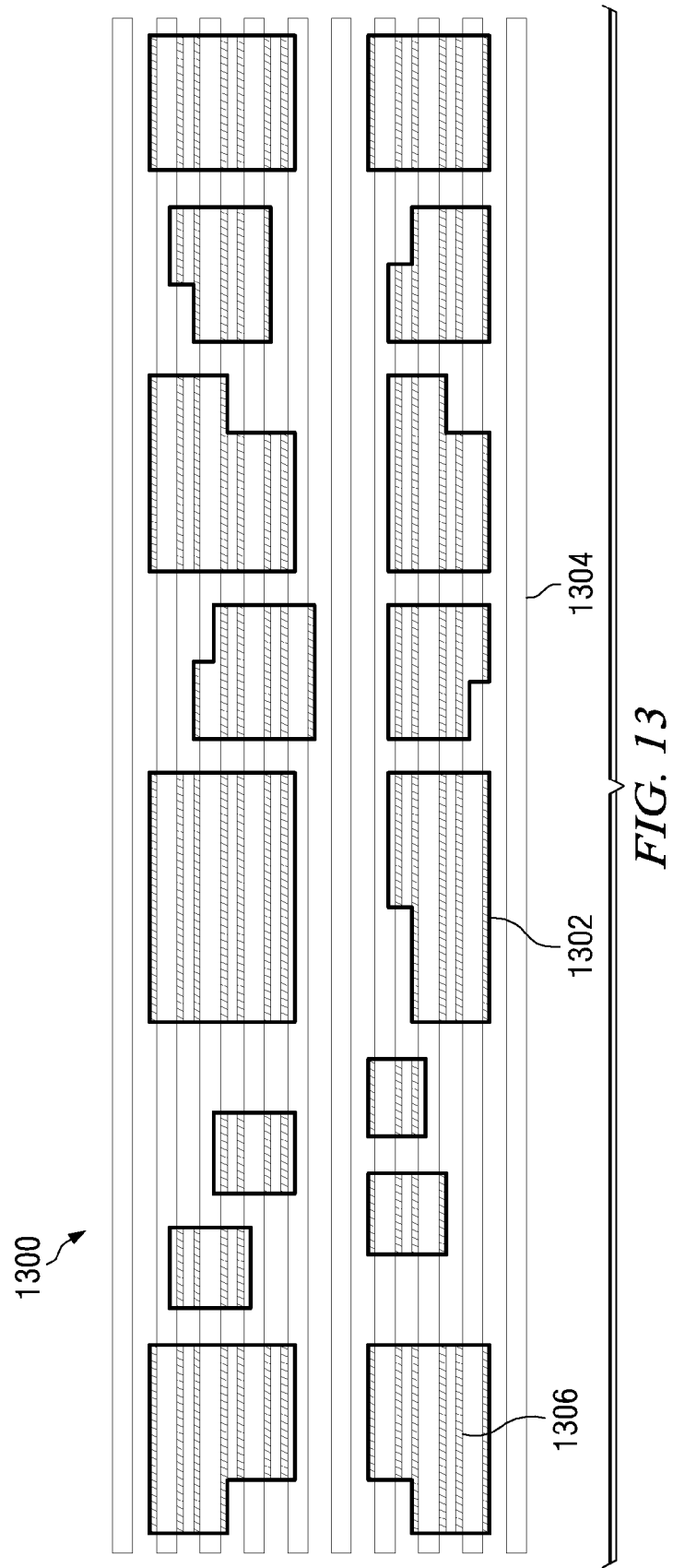

FIG. 13 illustrates a resultant pattern 1300. The resultant pattern 1300 includes a first pattern 1304 and a second pattern 1302 overlying the first pattern 1304. The first pattern 1304 includes a global-on-grid pattern of line elements. The first pattern 1304 may be substantially similar to dummy line features 904, described above with reference to FIGS. 9 and 10. The first pattern 1304 includes a global-on-grid pattern of line elements that may define dummy line features used in a half critical dimension process (such as described above with reference to FIG. 1). Spacer elements 1306 may be provided adjacent the line elements of the first pattern 1304. The second pattern 1302 may define an active area of a device. In an embodiment, the spacer elements 1306 are provided only within the area defined by the second pattern 1302. The second pattern 1302 may be substantially similar to the pattern 906 of FIGS. 9 and 10. The resultant pattern 1300 may be substantially similar to the resultant pattern described above with reference to step 808 of FIG. 8.

Figure 14:
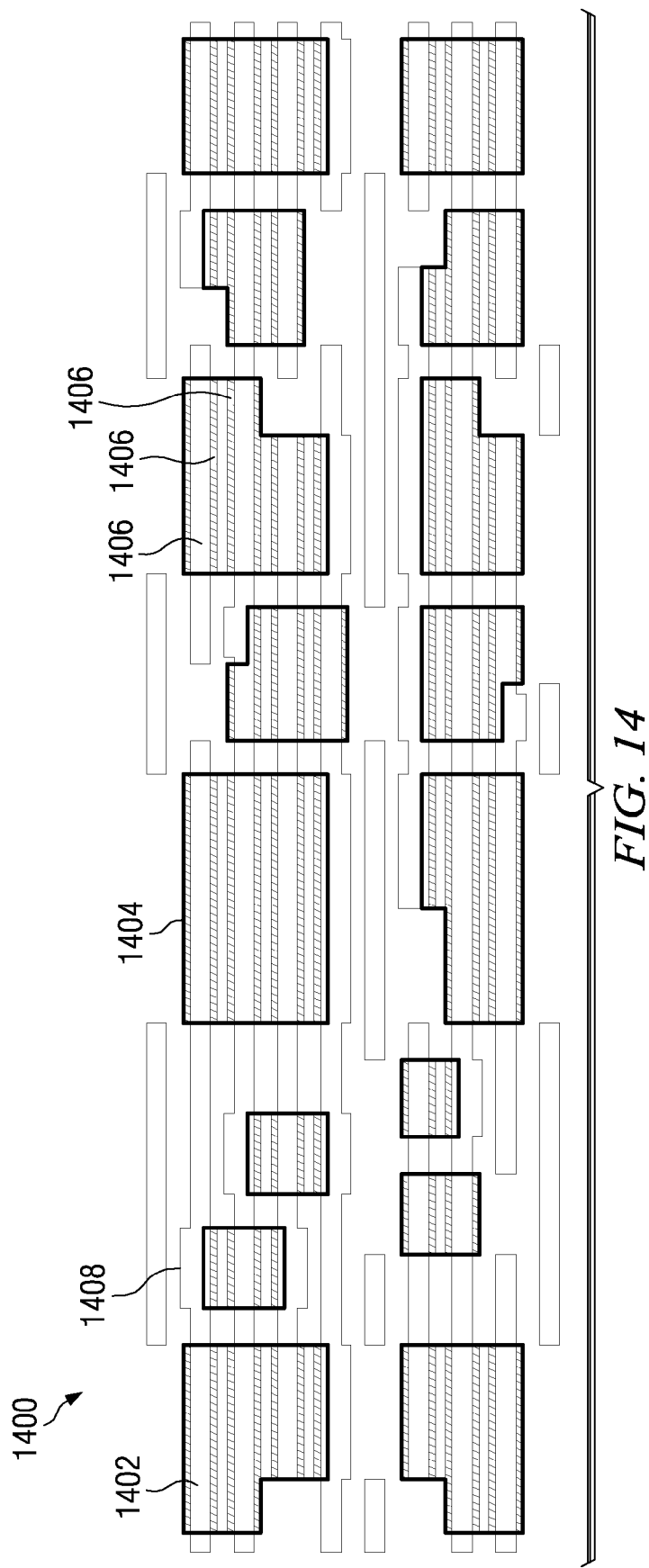

FIG. 14 illustrates an embodiment of the resultant pattern 1300 after a bias has been applied, for example, after the step 810 of the method 800 has been applied to the layout design. The biased pattern 1400 includes a first pattern 1402. The first pattern 1402 includes a local-on-grid pattern of line elements within an area defined by a second pattern 1404. These local-on-grid line elements provide spacer elements 1406 that allow for on-grid pitch with a localized area. The spacer elements 1406 may be used to form fin elements of a device. The first pattern 1402 also includes lines having bias regions as illustrated by line section 1408. The resultant pattern 1400 including its local-on-grid pattern may be used in the formation of a semiconductor device. In an embodiment, the first pattern 1402 and the second pattern 1404 may be used in steps 102 and 106 of the method 100, respectively.

Figure 15:
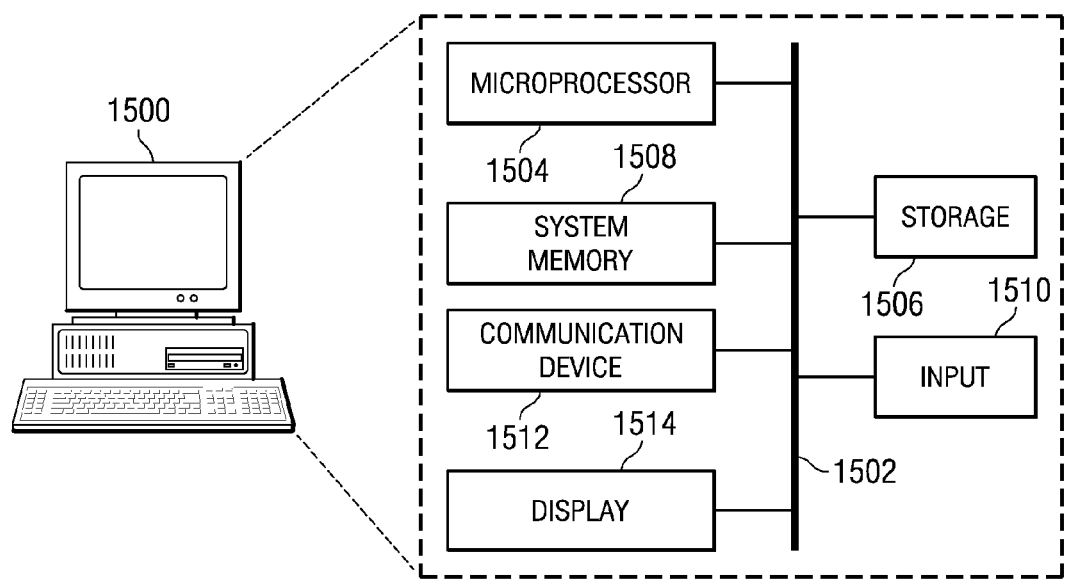
FIG. 15 is a schematic view of an embodiment of a computer system.

One system for providing the disclosed embodiments is illustrated in FIG. 15. Illustrated is an embodiment of a computer system 1500 for implementing embodiments of the present disclosure including the systems and methods described herein. In an embodiment, the computer system 1500 includes functionality providing for one or more steps of designing a circuit or chip including performing simulations, verification analysis (e.g., DRC, LVS), extraction of parameters, layout, place and route, DFM, and/or other suitable tools and/or procedures.

The computer system 1500 includes a microprocessor 1504, an input device 1510, a storage device 1506, a system memory 1508, a display 1514, and a communication device 1512 all interconnected by one or more buses 1502. The storage device 1506 may be a floppy drive, hard drive, CD-ROM, optical device or any other storage device. In addition, the storage device 1506 may be capable of receiving a floppy disk, CD-ROM, DVD-ROM, or any other form of computer-readable medium that may contain computer-executable instructions. The communications device 1512 may be a modem, a network card, or any other device to enable the computer system to communicate with other nodes. It is understood that any computer system 1500 could represent a plurality of interconnected computer systems such as, personal computers, mainframes, PDAs, and telephonic devices.

The computer system 1500 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The system memory 1508 may be configured to store a design database, library, technology files, design rules, PDKs, models, decks, and/or other information used in the design of a semiconductor device.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 1500 may be used to implement one or more of the methods and/or devices described herein. In particular, the computer system 1500 may be operable to generate, store, manipulate, and/or perform other actions on a layout pattern (e.g., GDSII file) associated with an integrated circuit. For example, in an embodiment, one or more of the patterns described above may be generated, manipulated, and/or stored using the computer system 1500. The patterns provided by the computer system 1500 may be in a typical layout design file format which are communicated to one or more other computer systems for use in fabricating photomasks including the defined patterns.

What is claimed is:

1. A method, comprising:
    providing a first pattern, wherein the first pattern comprises an array of dummy line features and a plurality of spacer elements abutting the dummy line features;
    providing a second pattern, wherein the second pattern defines an active region of an integrated circuit device;
    determining an edge spacer element of the plurality of spacer elements of the first pattern, wherein the edge spacer element is a spacer element nearest an edge of the active region; and
    biasing a first dummy line feature of the array of dummy line features, wherein the first dummy line feature is adjacent an edge spacer element and outside the active region.

2. The method of claim 1, wherein the biasing the first dummy line feature comprises increasing the width of the first dummy line feature.

3. The method of claim 1, wherein the integrated circuit device includes a plurality of FinFET devices and wherein the array of dummy line features defines a pitch of the fins of the plurality of FinFet devices.

4. The method of claim 1, wherein the integrated circuit device includes a plurality of FinFET devices and wherein the spacer elements define a width of the fins of the plurality of FinFet devices.

5. The method of claim 1, wherein the array of dummy line features of the first pattern is a global-on-grid array of dummy line features, and wherein the biasing the first dummy line produces a modified first pattern, wherein the modified first pattern includes a plurality of localized-on-grid arrays of dummy line features.

6. The method of claim 1, wherein the determining the edge spacer element of the active region includes performing a logic operation procedure.

7. The method of claim 1, wherein the determining the edge spacer element of the active region includes identifying a location on the integrated circuit layout wherein an overlay offset margin between the first pattern and the second pattern is below a selected value.

8. A method, comprising:
    generating a first layout pattern and a second layout pattern for an integrated circuit, wherein the first pattern includes a global-on-grid array of dummy line features, and wherein the dummy line features define a pitch for fins of a plurality of finFet devices;
    performing a logic operation procedure on the first layout pattern and the second layout pattern, wherein the logic operation procedure identifies a location having a critical overlay margin between the first layout pattern and the second layout pattern; and generating a third pattern, wherein the generating the third pattern includes modifying the first layout pattern in response to the location having the critical overlay margin, wherein the modifying comprises biasing a first dummy line feature, wherein the first dummy line feature is outside an area defined by the second layout pattern.

9. The method of claim 8, further comprising:
using the third pattern to generate a first photomask associated with the integrated circuit device; and
using the second pattern to generate a second photomask associated with the integrated circuit device.

10. The method of claim 8, further comprising:
exposing a semiconductor substrate to the third pattern; and
exposing the semiconductor substrate to the second pattern, after the substrate has been exposed to the third pattern.

11. The method of claim 8, further comprising:
using the third pattern to generate an array of dummy features on a semiconductor substrate; and
using the second pattern to remove at least one dummy feature generated by the third pattern from the semiconductor substrate.

12. The method of claim 8, wherein the third pattern and the second pattern have a greater overlay margin than the first pattern and the second pattern.

13. The method of claim 8, further comprising:
providing a semiconductor substrate;
forming a dummy layer on the semiconductor substrate;
exposing the semiconductor substrate to the third pattern to form a plurality of dummy line features in the dummy layer;
depositing a spacer material on the plurality of dummy line features;
etching the spacer material to form spacer elements adjacent the dummy line features; and
exposing the substrate including the spacer elements to the second pattern to define an active area.

14. The method of claim 8, further comprising:
forming a final layout for the integrated circuit device, wherein the final layout includes the third pattern and the second pattern, and wherein the final layout includes a grid array of dummy line features in an area defined by the second pattern.

15. An apparatus comprising a computer-readable medium encoded with a computer program that, when executed:
provides a first layout pattern and a second layout pattern for an integrated circuit, wherein the first pattern includes a global-on-grid array of dummy line features, and wherein the dummy line features define a pitch for fins of a plurality of finFet devices;
performs a logic operation procedure on the first layout pattern and the second layout pattern, wherein the logic operation procedure identifies a location having a critical overlay margin between the first layout pattern and the second layout pattern; and
modifies the first layout pattern in response to the location having the critical overlay margin, wherein the modifying comprises biasing a first dummy line feature, wherein the first dummy line feature is outside an area defined by the second layout pattern.

16. The apparatus of claim 15, wherein the modified first layout pattern includes local-on-grid arrays of dummy line features inside an area defined by the second layout pattern.

17. The apparatus of claim 15, wherein the first feature is a dummy line adjacent an edge feature of the first layout pattern, wherein the edge feature includes a spacer element at an edge of an active area defined by the second pattern.

18. The apparatus of claim 15, wherein the biasing includes increasing the width of the dummy line feature.

19. The apparatus of claim 15, further comprising a computer program that when executed:
sends the modified first pattern and the second pattern to a tool associated with photomask fabrication.

20. The apparatus of claim 15, wherein the biasing includes increasing the width of the dummy line feature by between approximately 3 and 30 nanometers.

* * * * *